United States Patent
Sugiyama

(10) Patent No.: US 7,706,911 B2
(45) Date of Patent: Apr. 27, 2010

(54) YIELD ESTIMATION METHOD FOR LSI

(75) Inventor: Hiroyuki Sugiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 549 days.

(21) Appl. No.: 11/679,884

(22) Filed: Feb. 28, 2007

(65) Prior Publication Data

US 2008/0010032 A1 Jan. 10, 2008

(30) Foreign Application Priority Data

Jul. 10, 2006 (JP) ............................. 2006-188809

(51) Int. Cl.
 *G01R 23/00* (2006.01)
 *G06F 19/00* (2006.01)
(52) U.S. Cl. ........................................ 700/121; 702/57
(58) Field of Classification Search ................. 702/57, 702/75; 700/121
 See application file for complete search history.

(56) References Cited

U.S. PATENT DOCUMENTS 6,463,570 B1 * 10/2002 Dunn et al. ................... 716/4

7,620,510 B2 * 11/2009 Carpenter et al. ............. 702/75
2008/0125258 A1 * 5/2008 Oseto ........................... 474/80
2008/0195337 A1 * 8/2008 Agarwal et al. ............... 702/75

FOREIGN PATENT DOCUMENTS

| JP | 11-330449 | 11/1999 |
| JP | 2001-159806 | 6/2001 |
| JP | 3364109 | 10/2002 |

* cited by examiner

*Primary Examiner*—Evan Pert
(74) *Attorney, Agent, or Firm*—Staas & Halsey LLP

(57) ABSTRACT

Using data obtained by varying intra-chip variance, a frequency distribution of a yield corresponding to each intra-chip variance is obtained by a statistical timing analysis. The frequency of a ring oscillator loaded into the chip of an LSI is measured for each chip, and the frequency distribution of the ring oscillator is obtained. The convolution between the frequency distribution of a yield corresponding to each intra-chip variance and the frequency distribution of the ring oscillator is performed. By integrating the results the cumulative probability distribution of the yield of the LSI corresponding to each intra-chip variance is obtained. The fit is rendered between the distribution and the yield distribution of the LSI chip of the past lot, an appropriate intra-chip variance value is obtained, the cumulative probability distribution corresponding to the value is similarly calculated, and the result is defined as an estimated distribution of the yield of the LSI chip.

16 Claims, 10 Drawing Sheets

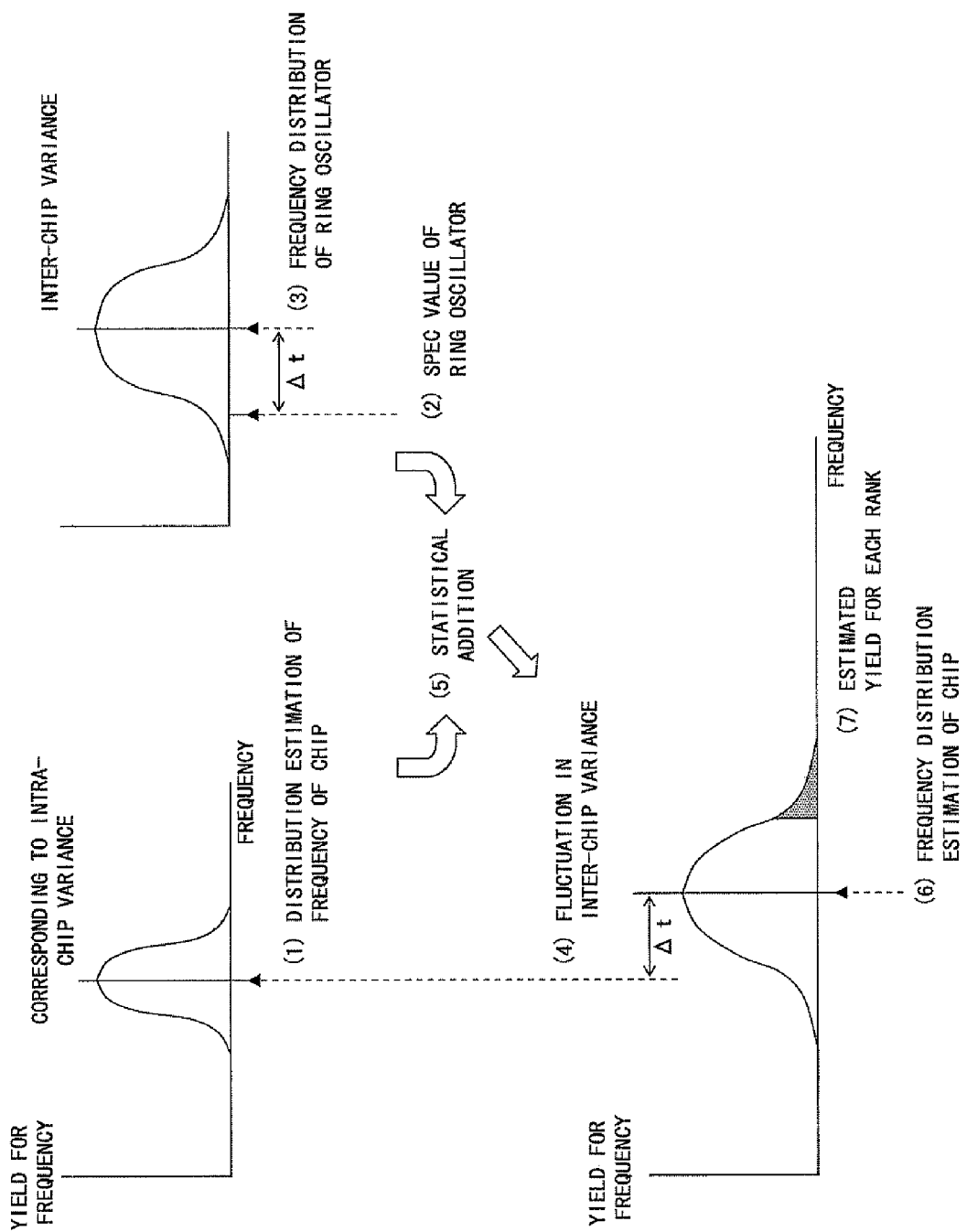
F I G. 1

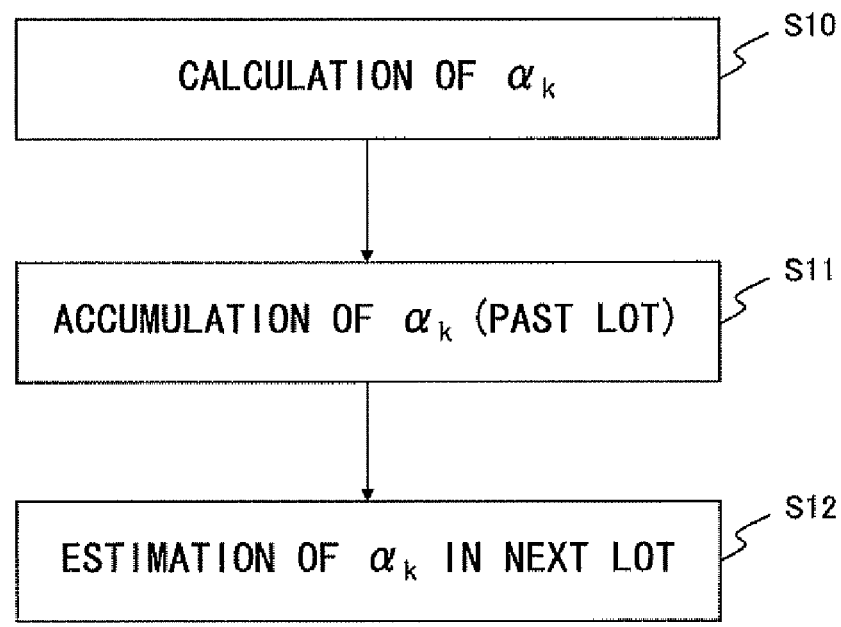
F I G. 5

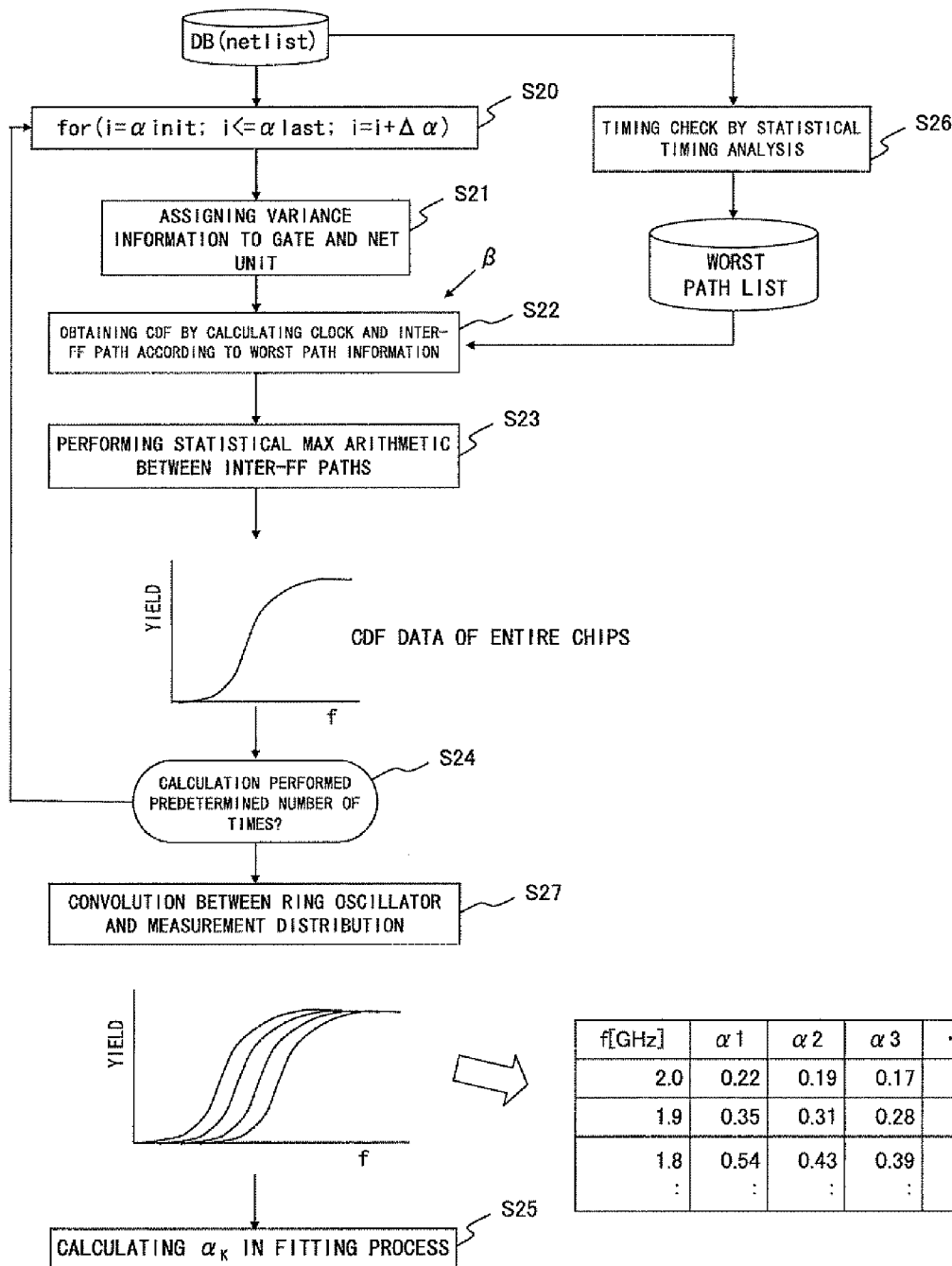
F I G. 7A
F I G. 7B

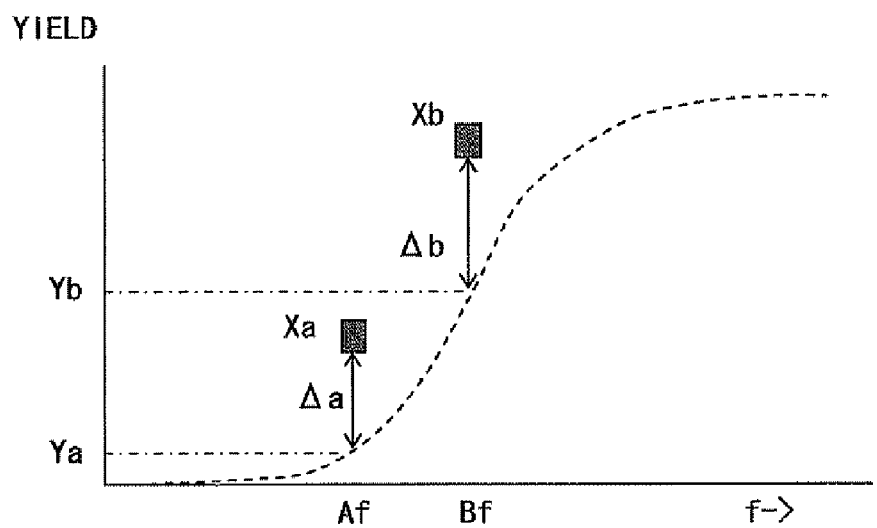
F I G. 8

| lot No | $\alpha_k$ |
|--------|------------|
| lot-1  | 0.13       |
| lot-2  | 0.10       |
| :      | :          |

F I G. 9

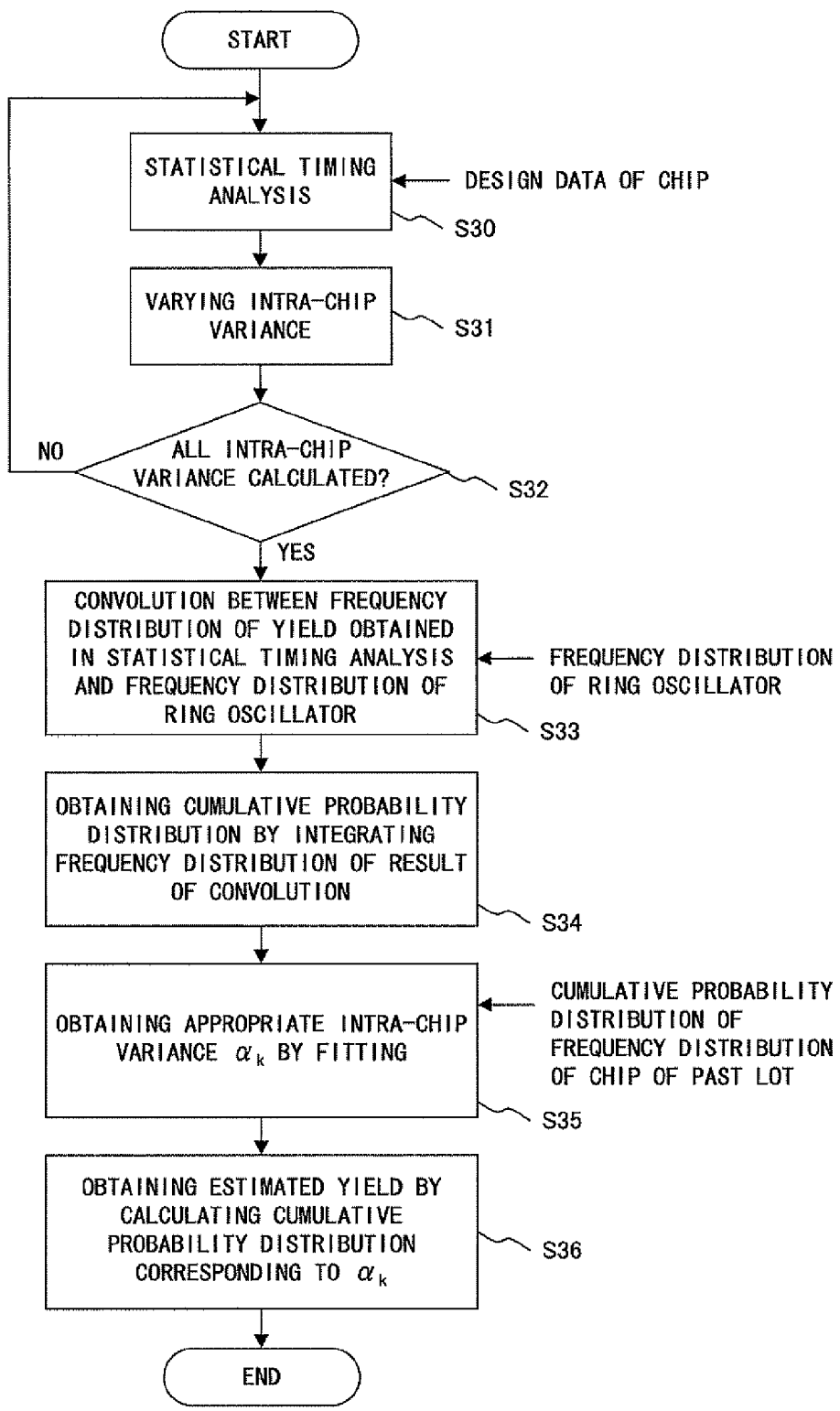
F I G. 10

YIELD ESTIMATION METHOD FOR LSI

BACKGROUND OF THE INVENTION

1. Field of the Invention

The present invention relates to a method for estimating the yield of an LSI satisfying predetermined standards of a frequency operation.

2. Description of the Related Art

A plurality of LSIs are formed on a wafer segmented from a lot, and each LSI is segmented from the wafer, thereby producing LSIs. However, an LSI has a different frequency characteristic depending on which portion of a wafer it is formed although a plurality of LSIs are produced on the same wafer. Therefore, each LSI chip formed on the same wafer has a variance in frequency characteristic although a plurality of LSI chips are formed on the same wafer. Similarly, since a number of wafers are segmented from one lot, each wafer indicates a variance in frequency characteristic among the chips of LSIs. Especially, an ultrafast LSI chip in the forefront of technology cannot be designed with sufficient specifications of an LSI, but is designed by setting the specifications of the LSI close to a requested operation frequency.

When the operation frequency of an LSI is low, the specifications of the operation frequency can be set higher than a requested operation frequency at the designing stage with the yield of the LSI (yield of the LSI satisfying a predetermined frequency characteristic) taken into account, and designed and produced. Therefore, the yield of the LSI satisfying the requested operation frequency characteristic is high, the number of LSIs to be discarded to satisfy the operation frequency characteristic after the purchase of the LSI can be low, and a wasteful cost can be reduced.

However, since the specification of the operation frequency of an LSI operating at an ultrafast speed cannot be set sufficiently higher than a requested operation frequency at the designing stage, the yield of the LSI satisfying the requested operation frequency becomes lower. Therefore, the yield of the LSI satisfying the requested operation frequency is low and the number of LSIs available for producing a desired device is small. Accordingly, in this case, the yield of the LSI is estimated in advance, the number of LSIs larger than a necessary number are purchased on the basis of the estimated yield, and the LSIs available for a desired device are selected from among the purchased LSIs and used. However, if the yield of the LSI is not correctly estimated, there is a shortage of LSIs or redundant LSIs, thereby incurring an undesired cost condition.

The patent document 1 describes a method for estimating the yield of an integrated circuit. The patent document 2 describes a high-precision simulation method in producing a semiconductor device. The patent document 3 describes a method for enhancing the yield in the semiconductor integrated circuit printing process.

[Patent Document 1] Japanese Patent Application Publication No. H10-294247

[Patent Document 2] Japanese Patent Application Publication No. H11-330449

[Patent Document 2] Japanese Patent Application Publication No. 2001-159809

As described above, it is conventionally necessary to estimate the yield of an LSI in advance, and purchase a larger number of LSIs than they are required, and the estimation has depended on the experience and guesswork of a user.

SUMMARY OF THE INVENTION

The present invention aims at providing a yield estimation method capable of correctly estimating the yield of an LSI independently of the experience or guesswork of a person.

The yield estimation method according to the information processing device is a method for estimating a yield of an LSI chip from an old yield of the LSI chip, calculating the frequency distribution of the yield of the LSI on a plurality of variance values of the frequency characteristic of a component of the LSI according to the design information about the LSI, inputting the frequency distribution of a ring oscillator embedded in the LSI chip obtained by measurement, performing a convolution between each frequency distribution of the yield of the LSI and the frequency distribution of the ring oscillator, obtaining a cumulative probability distribution of the frequency distribution of each yield, rendering the fit between the cumulative probability distribution obtained from the past frequency distribution of the LSI chip and each cumulative probability distribution obtained as a result of the convolution, thereby appropriately determining the variance value of the frequency characteristics of the component of the LSI, and obtaining an estimated yield for each frequency of the LSI chip from the calculated frequency distribution of the yield of the LSI and the frequency distribution of the ring oscillator on the basis of the determined variance value.

According to the present invention, the estimation of an LSI conventionally performed by the experience and guesswork of a person can be automatically performed, thereby producing a device using an ultrafast LSI at a lower cost independently of an expert at estimating a yield.

BRIEF DESCRIPTION OF THE INVENTION

FIG. 1 is an explanatory view of the outline of the process according to a mode for embodying the present invention;

FIG. 5 is a detailed explanatory view (1) of a mode for embodying the present invention;

FIGS. 7A and 7B are detailed explanatory views (3) of a mode for embodying the present invention;

FIG. 8 is a detailed explanatory view (4) of a mode for embodying the present invention;

FIG. 9 is a detailed explanatory view (5) of a mode for embodying the present invention; and FIG. 10 is a flowchart showing the entire flow of the process according to a mode for embodying the present invention.

DESCRIPTION OF THE PREFERRED EMBODIMENTS

Figure 2:
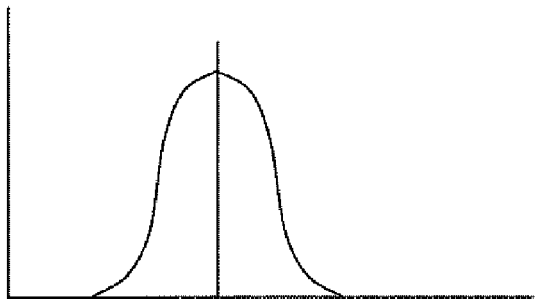
FIG. 2 is an explanatory view (1) of the statistical addition.
Figure 2:
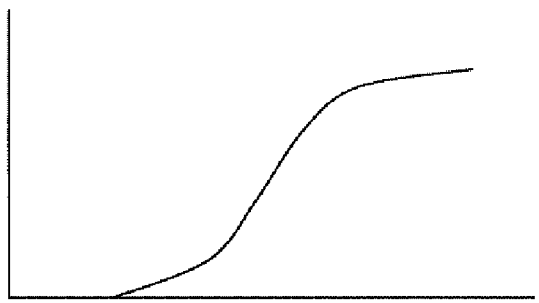

In the yield estimation method according to a mode for embodying the present invention, considerations are given in accordance with the following steps.

Step 1: A statistical timing analysis is performed on the design data, and an estimate of a frequency distribution of yields of a chip is obtained with the intra-chip variance taken into account. The intra-chip variance refers to the variance of the operation frequency in each LSI that is caused by the production variance of the operation of a component of a plurality of FFs (flipflops) and the like.

Step 2: The specification value of the oscillation frequency of the ring oscillator embedded in an LSI chip, and the information about the ring oscillator oscillation frequency of the chip whose frequency yield is to be estimated are collected for a plurality of chips and compared with each other. When there is a difference between the specification value of the oscillation frequency of the ring oscillator and the actually measured oscillation frequency distribution of the ring oscillator, it is considered that the center of the ring oscillator oscillation frequency of the chip to be estimated has been shifted from the specification value due to the inter-chip variance. The inter-chip variance refers to the variance between the operation and the ring oscillator oscillation frequency among a plurality of LSI chips that is caused by a difference and the like in location of a wafer from which the LSI chip is produced.

Step 3: It is considered that the estimate of the frequency distribution of the yield of the chip for which the intra-chip variance is taken into account appears as the fluctuation for the inter-chip variance as a shift between the specification value of the ring oscillator and the actual oscillation frequency distribution of the ring oscillator.

Step 4: A statistical addition of distributions is performed to add the influence of the fluctuation for the inter-chip variance to the estimate of the frequency distribution of the yield of the chip with the intra-chip variance taken into account. The result is an estimate of the frequency distribution with the intra-chip variance taken into account. From the estimate of the distribution, a yield can be estimated for each rank. The rank refers to the frequency range when the LSI is classified for each frequency range on the basis of the result of checking at which frequency the LSI can be actually operated after purchasing an LSI chip.

In the above-mentioned estimate, the value of the intra-chip variance (referred to as $\alpha_k$ indicating the range (standard deviation) of the frequency distribution when the frequency characteristic of the FF and the like in the chip input as initial data when the frequency distribution of a yield is calculated by performing a statistical timing analysis is regarded as a Gaussian distribution) is fixed to a certain value to estimate the frequency yield in a lot unit.

Furthermore, according to the mode for embodying the present invention, the intra-chip variance $\alpha_k$ matching the data of the yield obtained in the past is acquired by rendering the fit with the data obtained from the yield of the LSI chip used in the past with the intra-chip variance $\alpha_k$ to be variable. Using the intra-chip variance $\alpha_k$, a yield of an LSI chip to be newly purchased is estimated. Thus, a more accurate yield can be estimated.

FIG. 1 is an explanatory view of the outline of the yield estimating process according to a mode for embodying the present invention.

The drawings shown at the upper left portion in FIG. 1 indicate a chip yield distribution obtained as a result of the statistical timing analysis on the intra-chip variance using an appropriate value (for example, 10%) without considering the inter-chip variance. In FIG. 1, the horizontal axis indicates a frequency, and the vertical axis indicates the yield of a chip and the number of occurrences of each frequency. As shown in the upper column shown in FIG. 1, the intra-chip frequency distribution is obtained.

The drawings shown at the upper right in FIG. 1 indicates the ring oscillator oscillation frequency distribution among a plurality of chips obtained as a result of the measurement of the ring oscillator oscillation frequency on all chips in the same lot. FIG. 1(3) shows an average value obtained from the distribution obtained by measuring the oscillation frequency of the ring oscillator of all chips in the same lot. The arrow shown in (2) indicates a specification value of the ring oscillator oscillation frequency. Thus, the shift ($\Delta t$) between the specification value of (2) and the oscillation frequency (3) is obtained.

In the statistical addition shown in FIG. 1(5), the intra-chip frequency distribution and the inter-chip frequency distribution/variance are processed by convolution. From the result, the frequency distribution of a chip can be obtained with the intra- and inter-chip variances taken into account as shown by (6) at the lower column in FIG. 1. In this process, the previously obtained $\Delta t$ is taken into consideration. The fluctuation $\Delta t$ of the inter-chip variance of (4) appears as a shift from the intra-chip variance (1) of the frequency distribution (6) obtained as a result of the statistical addition. The distribution of (6) is divided for each frequency region, and each region is integrated, thereby obtaining an estimated yield (7) of the LSI chip for each frequency rank.

Figure 3:
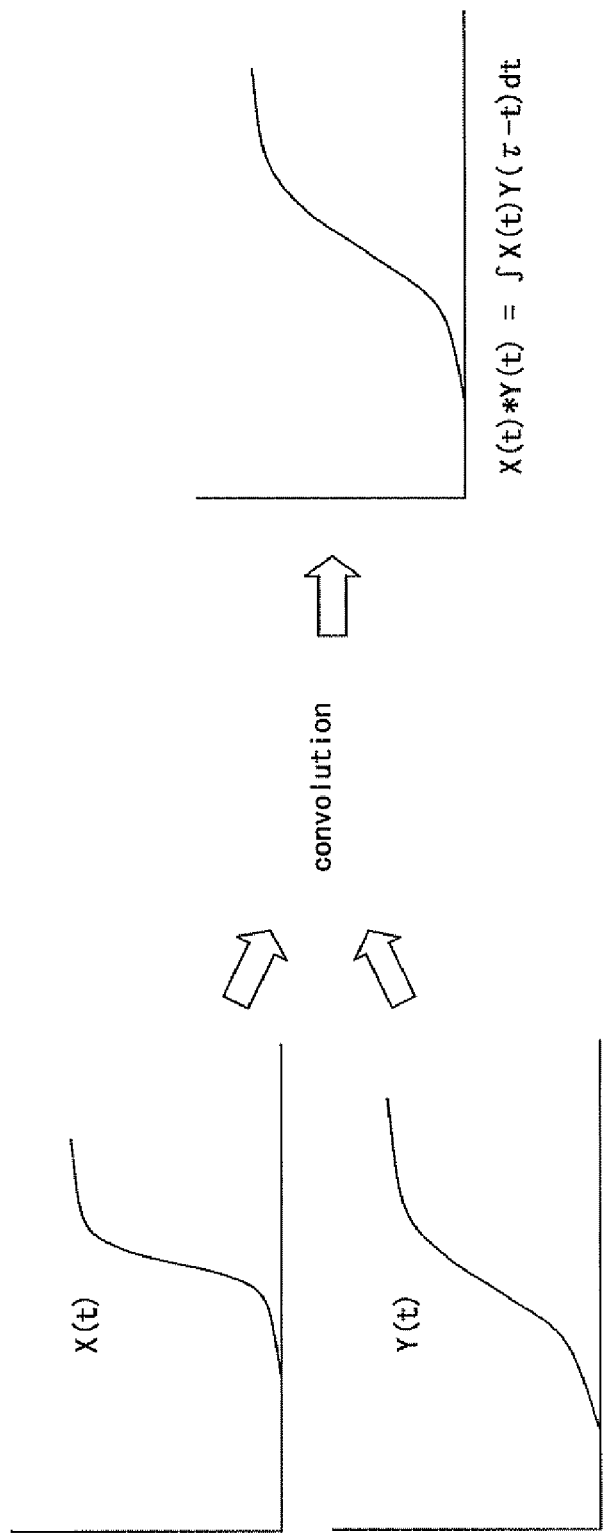
FIG. 3 is an explanatory view (2) of the statistical addition.

FIGS. 2 and 3 are explanatory views of statistical additions. First, the distribution is explained below. A distribution function can be, as shown in FIG. 2, a probability density function (PDF as a frequency distribution of a yield in the example above) and a cumulative distribution function (CDF) obtained by integrating the probability density function. When the CDF is differentiated, the PDF can be obtained. The statistical addition is performed by the convolution as shown in FIG. 3. Since the arithmetic method and characteristics of the convolution are well known, the explanation is omitted here.

Figure 4:
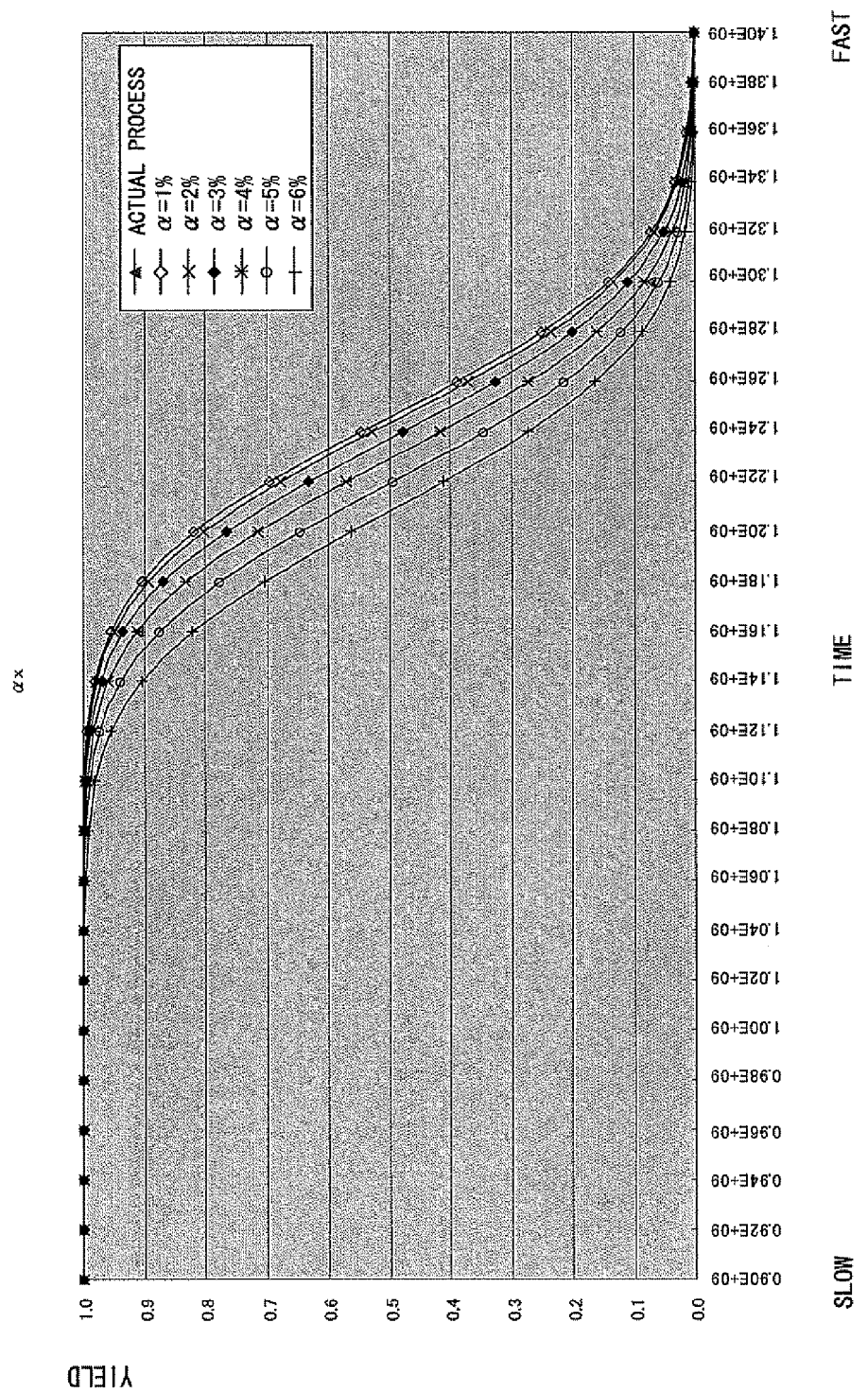
FIG. 4 is an explanatory view of a method of obtaining an intra-chip variance $\alpha_k$.

FIG. 4 is an explanatory view of obtaining the intra-chip variance $\alpha_k$.

Fundamentally, all frequency distributions of the chip acquired for the past lot are measured as frequency yield distributions (cumulative distribution functions). That is, relating to the past lot, the distribution of (6) shown in FIG. 1 is obtained in advance. The oscillation frequency distribution of the ring oscillator shown in FIG. 1(3) is assumed to be known by measuring each chip. Then, the intra-chip variance is processed in the statistical timing analysis in which 0~30% different values such as 0%, 0.5%, 1%, 1.5%, ... are assumed, and the respective distributions are calculated (FIG. 4). The fit are rendered between the distribution and the well-known frequency yield distribution, and the matching point is defined as the intra-chip variance $\alpha_k$.

When a new LSI product is implemented, and there is no past statistical data, an average intra-chip variance of an old LSI product is used.

FIGS. 5 through 9 are detailed explanatory views of the mode for embodying the present invention. The estimation of the frequency yield distribution according to the mode for embodying the present invention includes, as shown in FIG. 5, the calculation of $\alpha_k$ in step S10, the accumulation of the past $\alpha_k$ in step S11, and the estimation of the $\alpha_k$ of the next lot in step S12.

An LSI chip is produced in units of a lot. The operation distribution can be obtained for a frequency by measuring the oscillation frequency of the ring oscillator for all produced chips. Thus, the inter-chip variance $\beta$ is obtained. The intra-chip variance $\alpha_k$ is obtained with the inter-chip variance $\beta$ fixed. However, since $\alpha_k$ takes a different value for each lot and cannot be obtained by a calculation. Therefore, $\alpha_k$ is assigned a range from, for example, 1% to 25% at predetermined intervals, a intra-chip variance is calculated, and the fit is rendered between each calculated intra-chip variance and the past $\alpha_k$ (step S10). The $\alpha_k$ obtained by the fitting is accumulated for each lot (step S11). Next, the intra-chip variance of the lot newly produced by the $\alpha_k$ of the past accumulated lot is estimated (step S12).

The intra-chip variance $\alpha_k$ in step S10 is explained below.

The data input by the system for performing the process according to the mode for embodying the present invention is listed below.

1. α init: initial value of intra-chip variance
2. α last: final value of intra-chip variance
3. Δα: increment of intra-chip variance when an iterative process is performed
4. β: inter-chip variance (measured from the ring oscillator)

The initial value and the final value of the intra-chip variance indicate the values when the intra-chip variance is changed and the intra-chip frequency distribution is calculated. Δα indicates the amount of change per intra-chip variance when the intra-chip variance is changed.

The output is shown as follows.

5. yield per frequency rank in a lot

Figure 6:
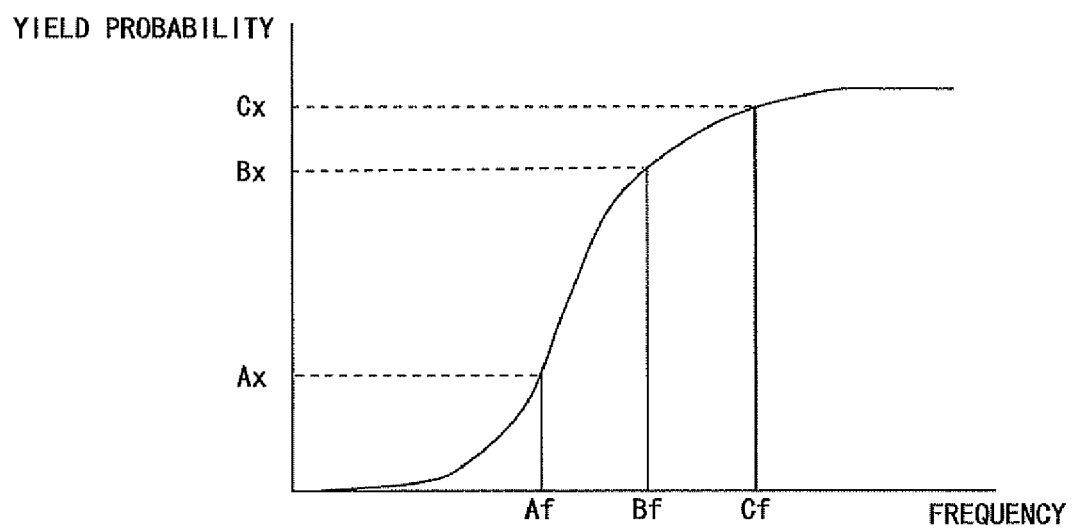
FIG. 6 is a detailed explanatory view (2) of a mode for embodying the present invention.

For example, if the yield distribution is obtained as shown in FIG. 6, the yield of the rank operating at 2.0[Ghz](Af) is defined as Ax, the yield of the rank operating at 1.8[Ghz](Bf) is defined as Bx, the yield of the rank operating at 1.6[Ghz](Cf) is defined as Cx, FIG. 7A is a detailed flowchart of the intra-chip variance calculating process according to the mode for embodying the present invention.

In step S26, a net list is read from the database, a timing check is performed using a STA (setup time analysis), and a worst path list is generated. A worst path list refers to listed path information about source FFs and sink FFs in order from the worst.

On the other hand, in the loop from step S20 to step S24, the intra-chip variance is changed and the calculation of the intra-chip frequency distribution is repeated. Under the condition in step S20 it is judged in step S24 whether or not a predetermined number of processes have been performed. In step S21, the initial information including the frequency characteristic obtained by assigning the variance information to the gate and net unit is generated. In step S22, according to the worst path information from the worst path list, a clock and an inter-FF path are calculated, and a CDF as an intra-chip frequency distribution is obtained. In step S23, a statistic max arithmetic is performed on each inter-FF path, and the CDF data of all chips are obtained. This process is performed at the frequency equal to the number of variable intra-chip variances. As a result, the CDF data can be obtained for a plurality of intra-chip variances α1, α2, α3, . . . . Therefore, the convolution between the data and the CDF data obtained by the measurement of the ring oscillator is performed. The convolution is performed on the PDF as the intra-chip frequency distribution and the PDF as the measurement frequency distribution of the ring oscillator. Then, the integration is performed to obtain the CDF of the yield, or the intra-chip frequency distribution and the PDF as the measured frequency distribution of a ring oscillator are first integrated to obtain the CDF of the chip and the CDF of the measurement value of the ring oscillator. Then, the convolution is performed to obtain the CDF of the yield.

From the CDF of the yield obtained after step S27, an yield for each rank in accordance with the value of each intra-chip variance as shown in FIG. 7B can be obtained. Then, in step S25, the optimum intra-chip variance $\alpha_k$ can be calculated in the fitting process.

FIG. 8 is an explanatory view of obtaining $\alpha_k$ by the fitting.

Xa: actual yield at the frequency Af
Xb: actual yield at the frequency Bf

When the above-mentioned conditions are given, the sum of the following differences is obtained by assuming that the CDF obtained by allocating α in the process above is indicated by the dotted line in the figure.

$$\Delta a = |Xa - Ya|$$

$$\Delta b = |Xb - Yb|$$

$$D = \Delta a - \Delta B$$

The value of D is calculated for each CDF obtained by allocating each α, The CDF having the smallest D is defined as an approximate solution, and α of the CDF is defined as $\alpha_k$. That is, after calculating a plurality of CDF, the sum of differences is obtained for each CDF, and the intra-chip variance α of the CDF having the smallest sum in the obtained sums is defined as $\alpha_k$ obtained as a result of the fitting.

The $\alpha_k$ of the next lot is obtained as follows.

Figure 9:
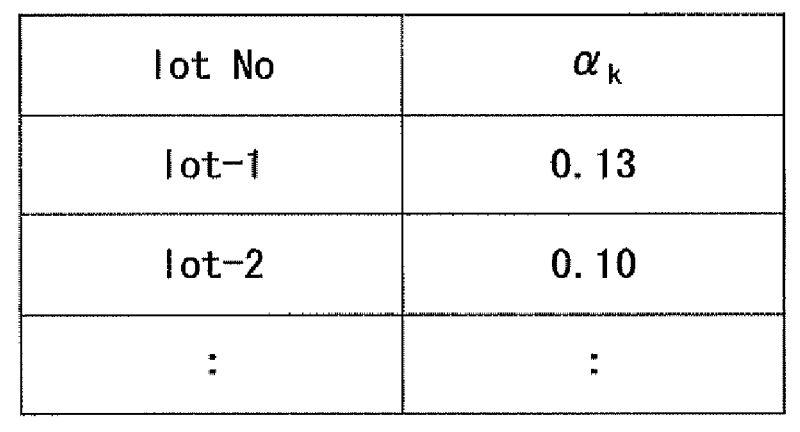

$\alpha_k$ relating to the past lot obtained in the above-mentioned process is stored in the table shown in FIG. 9. The n (for example, three by returning three times toward the past) closest $\alpha_k$ are retrieved. An average $\alpha_{next}$ of the retrieved $\alpha_k$ is obtained. $\alpha_{next}$ is defined as the $\alpha_k$ of the next lot.

Using the statistical timing analysis result corresponding to the thus determined $\alpha_k$ and the measurement result of the ring oscillator implemented by the LSI of the past lot, the cumulative probability distribution of the yield is obtained, thereby estimating the yield of the next lot.

FIG. 10 is a flowchart showing the entire flow of the process according to the mode for embodying the present invention.

In step S30, a net list and the like as the design data of a chip is input, and a statistical timing analysis is performed on one LSI chip. In step S31, the intra-chip variance is varied, and it is judged in step S32 whether or not the calculation has been performed on all intra-chip variances. If the judgment in step S32 is NO, control is passed to step S30, a new intra-chip variance is assumed, and the statistical timing analysis is performed. If the judgment in step S32 is YES, then the convolution is performed in step S33 between the frequency distribution of the yield corresponding to each intra-chip variance obtained in the statistical timing analysis and the frequency distribution obtained by the measurement of the ring oscillator. The frequency distribution of the ring oscillator obtained by measurement on the frequency of the ring oscillator actually loaded onto the LSI on all chips of one lot is used. In step S34, each distribution obtained as a result of the convolution is integrated, and the cumulative probability distribution (CDF) corresponding to each intra-chip variance is obtained. In step S35, the fit is rendered between the cumulative probability distribution obtained by integrating the frequency distribution of the chip in the past lot and the cumulative probability distribution obtained in step S34, and the appropriate intra-chip variance $\alpha_k$ is obtained. In step S36, the cumulative probability distribution corresponding to the $\alpha_k$ obtained in step S35 is calculated in the similar method as in steps S30 through S34, and the estimated yield value is obtained for each rank.

The above-mentioned processes can be automatically performed by a computer.

What is claimed is:

1. A yield estimation method for estimating a yield of an LSI chip, comprising:
   calculating a frequency characteristic distribution of a component of an LSI according to design information about the LSI; and
   obtaining the frequency characteristic distribution of an LSI chip on a basis of an operation frequency distribution in an oscillator of a plurality of LSI chips and an operation frequency distribution of the oscillation from a measurement result of an operation frequency of the oscillation provided in the plurality of LSI chips.

2. The method according to claim 1, further comprising:
   calculating an estimated yield of an LSI chip at an arbitrary frequency on a basis of a frequency characteristic distribution of the LSI chips.

3. The method according to claim 1, wherein
   the calculation of the frequency characteristic distribution of the LSI component is performed by a statistical timing analysis.

4. The method according to claim 1, wherein
   in the calculation of the frequency characteristic distribution of the LSI component, a plurality of variance ranges of the frequency distribution are set, and for each of the plurality of the variance ranges, the frequency characteristic distribution of the LSI component is calculated.

5. The method according to claim 1, wherein
   in the step of obtaining the frequency characteristic distribution of the LSI chip, the frequency characteristic distribution of the LSI component and the operation frequency distribution of the oscillator are processed by convolution.

6. The method according to claim 1, further comprising:
   obtaining a cumulative probability distribution of a yield depending on a frequency by statistically accumulating results of statistic additions.

7. A yield estimation method for estimating a yield of an LSI chip, comprising:
   calculating a first frequency characteristic distribution of an LSI component according to design information about an LSI;
   acquiring a second frequency characteristic distribution of the LSI component obtained previously;
   comparing the first frequency characteristic distribution with the second frequency characteristic distribution, and obtaining a third frequency characteristic distribution of the LSI component on a basis of a comparison result; and
   calculating an estimated yield of the LSI chip on a basis of the third frequency characteristic distribution.

8. The method according to claim 7, wherein:
   in the step of calculating the first frequency characteristic distribution, a plurality of frequency distribution variance ranges are set, and the first frequency characteristic distribution is calculated for each of the plurality of variance ranges;
   in the step of calculating the third frequency characteristic distribution, each of the plurality of first frequency characteristic distributions is compared with the second frequency characteristic distribution, and the first frequency characteristic distribution corresponding to the second frequency characteristic distribution is selected as the third frequency characteristic distribution.

9. The method according to claim 7, further comprising:
   obtaining an operation frequency distribution in the oscillators of the plurality of LSI chips from a measurement result of the operation frequency of the oscillator set in a plurality of LSI chips, wherein
   the estimated yield calculating step further comprises performing a statistical addition of the third frequency characteristic distribution and the operation frequency distribution.

10. The method according to claim 9, wherein
    the estimated yield calculating step performs convolution between the third frequency characteristic distribution and the operation frequency distribution.

11. The method according to claim 7, wherein
    the second frequency characteristic distribution is obtained on a basis of a plurality of frequency characteristic distributions obtained in past plural processes.

12. A yield estimation apparatus for estimating a yield of an LSI chip from a yield for each frequency of a past LSI chip, comprising:
    a yield frequency distribution calculation unit calculating a frequency distribution of a yield of an LSI for a plurality of variance values of a frequency characteristic of a component of the LSI according to design information about the LSI;
    an input unit inputting a frequency distribution of a ring oscillator embedded in an LSI chip obtained by measurement for a previous LSI chip;
    a convolution execution unit performing a convolution between each of the frequency distributions of the yield of the LSI and the frequency distribution of the ring oscillator;
    a cumulative probability distribution calculation unit obtaining a cumulative probability distribution on the frequency distribution of each yield from a result of the convolution;
    a variance determination unit determining an appropriate variance value of frequency characteristics of the components of an LSI by rendering fit between the cumulative probability distribution obtained from the frequency distribution of a past LSI chip and each cumulative probability distribution obtained as a result of convolution; and
    an estimated yield unit obtaining an estimated yield for each frequency of the LSI chip from the calculated frequency distribution of the yield of the LSI, and the frequency distribution of the ring oscillator on a basis of the determined variance value.

13. A program used to direct a computer to perform a yield estimation method for estimating a yield of an LSI chip from a yield for each frequency of a past LSI chip, comprising:
    calculating a frequency distribution of a yield of an LSI for a plurality of variance values of a frequency characteristic of a component of the LSI according to design information about the LSI;
    inputting a frequency distribution of a ring oscillator embedded in an LSI chip obtained by measurement for a previous LSI chip;
    performing a convolution between each of the frequency distributions of the yield of the LSI and the frequency distribution of the ring oscillator;
    obtaining a cumulative probability distribution on the frequency distribution of each yield from a result of the convolution;
    determining an appropriate variance value of frequency characteristics of the components of an LSI by rendering fit between the cumulative probability distribution obtained from the frequency distribution of a past LSI chip and each cumulative probability distribution obtained as a result of convolution; and obtaining an estimated yield for each frequency of the LSI chip from the calculated frequency distribution of the yield of the LSI, and the frequency distribution of the ring oscillator on a basis of the determined variance value.

14. The method according to claim 3, wherein
in the calculation of the frequency characteristic distribution of the LSI component, a plurality of variance ranges of the frequency distribution are set, and for each of the plurality of the variance ranges, the frequency characteristic distribution of the LSI component is calculated.

15. The method according claim 5, further comprising:
obtaining a cumulative probability distribution of a yield depending on a frequency by statistically accumulating results of statistic additions.

16. The method according to claim 8, further comprising:
obtaining an operation frequency distribution in the oscillators of the plurality of LSI chips from a measurement result of the operation frequency of the oscillator set in a plurality of LSI chips, wherein the estimated yield calculating step further comprises performing a statistical addition of the third frequency characteristic distribution and the operation frequency distribution.

\* \* \* \* \*

UNITED STATES PATENT AND TRADEMARK OFFICE
CERTIFICATE OF CORRECTION

PATENT NO. : 7,706,911 B2 Page 1 of 1
APPLICATION NO. : 11/679884
DATED : April 27, 2010
INVENTOR(S) : Hiroyuki Sugiyama It is certified that error appears in the above-identified patent and that said Letters Patent is hereby corrected as shown below:

Title page, item [57] Column 1 (Abstract), Line 9, change "results" to --result,--.

Signed and Sealed this

Thirteenth Day of July, 2010

David J. Kappos
*Director of the United States Patent and Trademark Office*